United States Patent [19]
Lach et al.

[11] Patent Number: 6,108,212
[45] Date of Patent: Aug. 22, 2000

[54] SURFACE-MOUNT DEVICE PACKAGE HAVING AN INTEGRAL PASSIVE COMPONENT

[75] Inventors: Lawrence E. Lach, Chicago; Gregory J. Dunn, Arlington Heights; Daniel R. Gamota, Palatine, all of Ill.

[73] Assignee: Motorola, Inc., Schaumburg, Ill.

[21] Appl. No.: 09/092,637

[22] Filed: Jun. 5, 1998

[51] Int. Cl.[7] .......................... H01L 23/522; H01L 23/532
[52] U.S. Cl. ........................ 361/768; 361/765; 361/766; 361/767; 361/772; 361/782; 361/783; 257/780; 257/533; 257/536; 257/537; 174/255; 338/330; 338/331; 338/333
[58] Field of Search ...................................... 174/253, 255, 174/260, 261, 262, 264, 265; 29/619, 620, 621; 257/528, 531, 532, 533, 536, 537, 538, 541, 692, 698, 723, 724, 904, 780; 338/315, 317, 320, 322, 326, 327, 328, 330, 331, 332, 333; 361/760, 763, 765, 766, 782, 783, 811, 767, 768, 772; 439/68, 82, 83

[56] References Cited

U.S. PATENT DOCUMENTS

| | | | |
|---|---|---|---|
| 4,777,718 | 10/1988 | Henderson et al. | 361/782 |
| 4,782,381 | 11/1988 | Ruby et al. | 361/782 |
| 5,347,258 | 9/1994 | Howard et al. | |
| 5,603,847 | 2/1997 | Howard et al. | |
| 5,912,507 | 6/1999 | Dunn et al. | 257/738 |

FOREIGN PATENT DOCUMENTS

| | | |
|---|---|---|
| 9-139608 | 5/1997 | Japan. |
| WO 94/23554 | 10/1994 | WIPO. |

*Primary Examiner*—Jeffrey Gaffin
*Assistant Examiner*—John B. Vigushim

[57] ABSTRACT

The surface-mount device package comprises a pad located on a face of the surface-mount device, a solder bump bonded to the pad, and a terminal spaced radially apart from the pad. A terminal surrounds the pad in at least one common plane that bisects the pad and the terminal. An electrically resistive volume intervenes between the pad and the terminal. The pad is electrically coupled to the terminal through the resistive volume. The terminal, the pad, and the electrically resistive volume cooperate to form a passive component associated with at least one device interconnection. The passive component preferable comprises an integral resistor. The integral resistor serves to eliminate or at least substantially reduce electrical resonances and reflections that may otherwise degrade the signal integrity.

29 Claims, 4 Drawing Sheets

SURFACE-MOUNT DEVICE PACKAGE HAVING AN INTEGRAL PASSIVE COMPONENT

This invention was made with Government support under Agreement No. F33615-96-2-1838 awarded by DARPA. The Government has certain rights in the invention.

FIELD OF THE INVENTION

The present invention generally relates to a surface-mount device package having an integral passive component. More particularly, this invention relates to a surface-mount device (SMD) package for an active surface-mount device having one or more solder pads associated with an integral passive component, which is capable of reducing undesired resonances and reflections of electrical signals.

BACKGROUND OF THE INVENTION

A ball-grid array (BGA) package is an illustrative example of a surface-mount package for an integrated circuit chip. Ball-grid array (BGA) packages house an integrated circuit (IC) chip that is either wire-bonded or flip-chip mounted to bond pads on the surface of an interposer. The interposer is generally a small circuit board or a semiconductor package for interfacing a circuit board.

In high-speed digital applications, electrical interconnections associated with the chip, the interposer, and the board interconnections of a BGA can exhibit electrical resonances and reflections that degrade signal integrity and electrical system reliability. Such degradations of signal quality generally increase with increasing signal frequencies or with digital signals that exhibit short rise times. Moreover, if power supply voltages are decreased to save energy, the detrimental affects on signal integrity may increase because of lowered electrical noise immunity.

In the past, discrete resistors have been placed in the signal path to reduce or eliminate unwanted resonances and signal reflections. However, additional cost, weight, assembly complexity, and reduced circuit density are incurred with the use of discrete resistors. Thus, a need exists for a resistor or a passive component which can reduce signal reflections for high-speed digital applications while meeting cost and circuit density objectives.

SUMMARY OF THE INVENTION

According to the present invention, an active surface-mount device has a surface-mount package equipped with one or more passive components integrated into at least one device interconnection. The surface-mount device package comprises a pad located on a face of the surface-mount device, a solder bump bonded to the pad, and a terminal spaced radially apart from the pad. The face may be an internal face located within the SMD package or an external face located on the outside of the SMD package. A terminal surrounds the pad in at least one common plane that bisects the pad and the terminal. An electrically resistive volume intervenes between the pad and the terminal. The pad is electrically and resistively connected to the terminal through the resistive volume. The terminal, the pad, and the electrically resistive volume cooperate to form a passive component associated with at least one external or internal device interconnection.

The passive component preferable comprises an integral resistor. The integral resistor is adapted to eliminate or at least substantially reduce electrical resonances and reflections that may otherwise degrade the signal integrity. Thus, the electrical system reliability associated with a printed wiring board (PWB), an IC, and a BGA package may be increased through the use of the integral resistor. The integral resistor may replace discrete resistors that would otherwise occupy space around the surface-mount device on a printed circuit board.

In one aspect of the invention, the terminal may be connected to electrical ground through an integral capacitor in series with the integral resistor. The integral capacitor is formed by a conductive plate and a dielectric material between the conductive plate and the terminal of the resistor. The conductive plate may be grounded, and may be capacitively coupled to any number of parallel integral resistors formed externally to or internally within the SMD package in accordance with this invention. The integral capacitor-resistor combination may control power dissipation through the integral resistor.

In another aspect of the invention, the integral resistor may be grounded through a conductor that is electrically coupled to ground and the terminal of the resistor. In this embodiment, a common resistor terminal can simultaneously connect a group of resistors in parallel to ground potential.

According to this invention, the conductive elements of the integral resistor and the integral capacitor can be formed by plating, screening, stenciling, photodefinition, mechanical planarization, and other known techniques. Suitable compositions for the resistive material include polymer thick film (PTF) inks that can be deposited by screening, stenciling, curtain coating, or the like. Such techniques and compositions enable suitable resistance values to be readily obtained for resistors formed in accordance with this invention without requiring modifications to the surface-mount device that would adversely affect processing and operational considerations. Notably, by adapting such processes to integrate resistors and resistor/capacitor combinations at the level of a surface-mount device instead of mounting conventional discrete resistors and capacitors on the substrate, the present invention may be employed to eliminate or at least substantially reduce electrical resonances and reflections that would otherwise degrade the signal integrity and electrical system reliability. In addition, the present invention increases the maximum potential circuit density of printed circuit boards by replacing discrete passive components with integral passive components that use less circuit board space than the discrete passive components do. Replacement of discrete capacitors and discrete resistors (i.e. chip resistors) with integral passive components allows reductions in assembly steps because the SMD package and one or more associated integral passive components may be simultaneously mounted in a single placement step, as opposed to the multiple placement steps required for separate SMD packages and discrete passive components.

DETAILED DESCRIPTION OF THE PREFERRED EMBODIMENT

Figure 1:
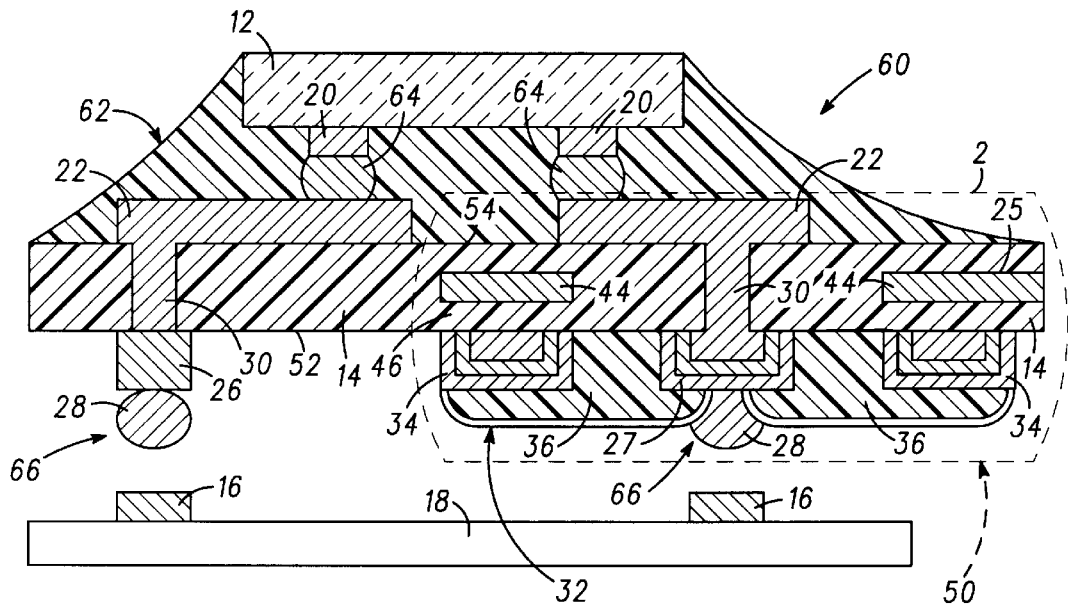
FIG. 1 is a cross-sectional view of a surface-mount device featuring an integral resistor-capacitor assembly.
Figure 2:
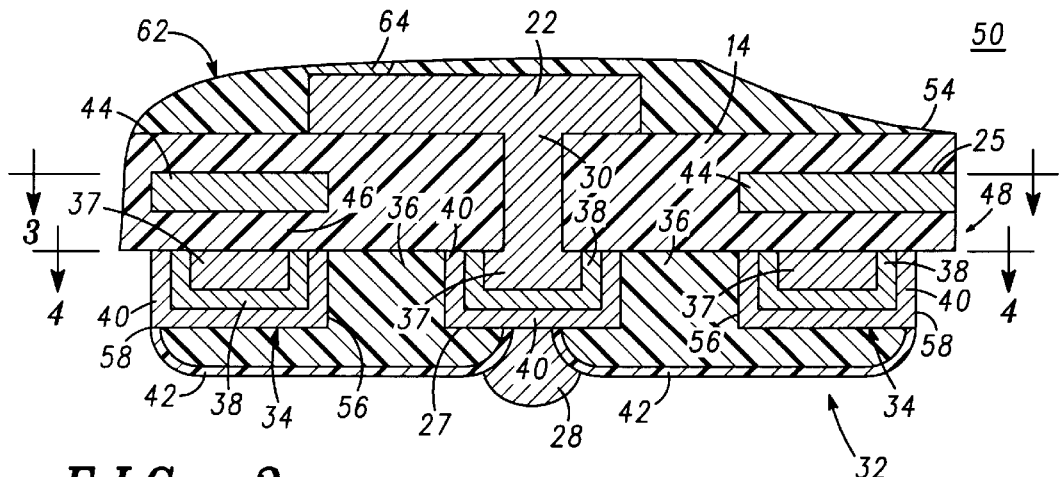
FIG. 2 is an enlarged view of the region labeled 2 in FIG. 1.
Figure 3:
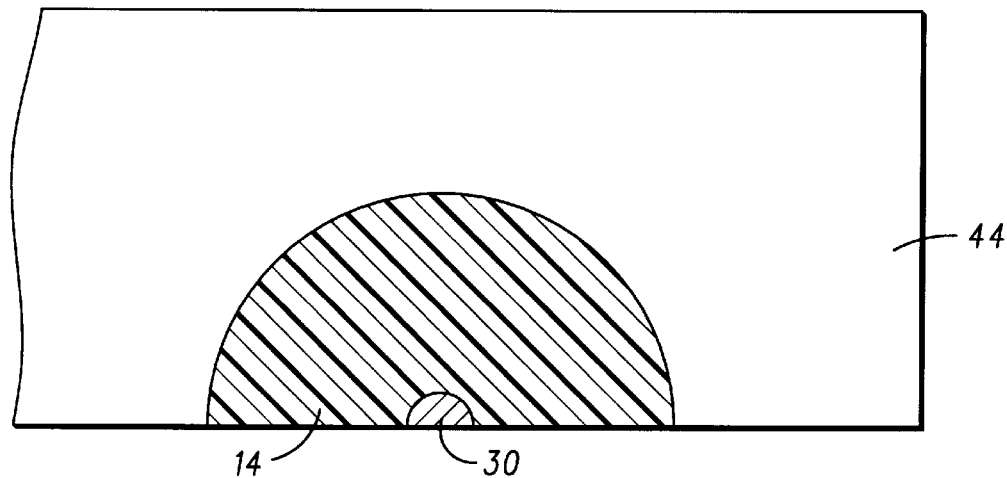
FIG. 3 is a cross-sectional view of an integral resistor-capacitor assembly as viewed along reference line 3—3 of FIG. 2.
Figure 4:
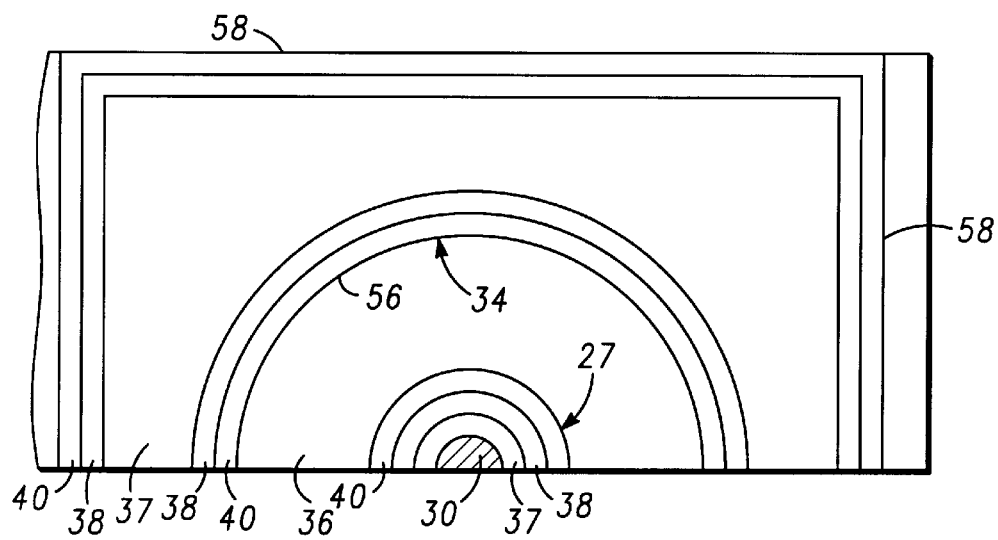
FIG. 4 is a cross-sectional view of an integral resistor-capacitor assembly as viewed along reference line 4—4 of FIG. 2.

In accordance with the present invention, FIG. 1 through FIG. 4, inclusive, show various cross-sectional views of an active (SMD) package 60 having an integral passive component. The integral passive component preferably comprises an integral resistor-capacitor combination 50 (as shown in FIGS. 1 and 2). However, in an alternate embodiment (represented by FIG. 10) the integral passive component may be limited to an integral resistor.

The surface-mount device 60 (SMD) comprises a component pad 27 located on a face of the package 60, a solder bump 28 bonded to the component pad 27, and a terminal 34 spaced radially apart from the component pad 27. The terminal 34 surrounds the component pad 27 in at least one common plane that bisects the component pad 27 and the terminal 34. An electrically resistive volume 36 intervenes between the pad 27 and the terminal 34. The pad is electrically and resistively connected to the terminal 34 through the resistive volume 36. The terminal 34, the component pad 27, and the electrically resistive volume 36 cooperate to form an integral resistor 32 associated with at least one device interconnection 66.

The SMD package 60 can be any active surface-mount device, such as ball grid array device. The SMD package 60 includes an active component or an integrated circuit. The SMD package 60 may be directly mounted to the surface of a printed circuit board 18 through solder bumps 28 or the like. The integrated circuit may include active components (i.e. diodes, transistors, and/or switches) and passive components (i.e. inductors, capacitors, and/or resistors). The active and passive components may be fabricated on a common semiconductor die 12 through semiconductor manufacturing processes, such as diffusion, passivation, masking, photoresist, and epitaxial growth.

The SMD package 60 includes an interposer 14 to provide electrical access to the active components and/or passive components. SMD packages are typically designed to provide hermetic sealing, environmental protection, and a desired form and size for the active and/or passive components on the die 12. The SMD package 60 has external interconnections 66 for connecting the active components to a printed circuit board. Internal interconnections 64 are located internally within the SMD package 60.

The integral passive component of the present invention is electrically associated with at least one external or internal interconnection 64 or 66 of the SMD package 60. In FIG. 1, the integral passive component is shown as being associated with the component pad 27, which is preferably substantially planar with other solderable pads 26 on the same surface-mount device package 60. The solderable pad 26 typically has a greater height than the component pad 27 such that the bottoms of the solderable pad 26 and the component pad 27 are substantially coplanar.

The interposer 14 has a first face 52 and a second face 54 opposite the first face 52. The surface-mount device package 60 preferably includes at least the component pad 27 and an external solderable pad 26 on the first face 52 of the interposer 14. The solderable pad 26 and the component pad 27 may be formed by plating, screening, stenciling, photodefinition, etching or any other suitable method known in the art. In a preferred embodiment, the component pad 27 is substantially cylindrical. A solder bump 28 may be bonded to the component pad 27 and the solderable pad 26. The solder bump 28 comprises solder, solder composed of an eutectic alloy, or the like.

The component pad 27 and the solderable pad 26 are preferably composed of a solderable metal; preferably a copper base 37 and alternately a nickel base. The copper base 37 may plated with a nickel layer 38 and a noble metal layer 40 as shown. The nickel layer 38 plates the copper base 37 and a noble metal layer 40 plates the nickel layer 38. The nickel layer 38 and noble metal layer 40 (preferably gold or silver) provide for solder wettability and electrically stable resistor terminations with generally consistent resistance over a desired longevity of the integral resistor 32. The nickel layer 38 and the noble metal layer 40 are preferably plated on the surface of the external solderable pad 26 and to the terminal 34 to any suitable thickness, e.g., about 0.1 to about 10 micrometers, by conventional processes. While both layers 38 and 40 are shown, the nickel layer 38 or the noble metal layer 40 could be used alone to plate or clad the copper base 37.

The terminal 34 is located on the first face 52. The terminal 34 has an inner perimeter 56 and an outer perimeter 58. The inner perimeter 56 is generally curved, while the outer perimeter 58 is preferably rectilinear to increase the surface area of the terminal 34 defined between the outer perimeter 58 and the inner perimeter 56. The terminal surface area of the terminal 34 is optimized to form a plate of an integral parallel plate capacitor 48 with a desired capacitance related to the terminal surface area. The increased surface area of the terminal 34 allows greater capacitances to be obtained with the integral resistor-capacitor than would otherwise be possible with an annular terminal. While the inner perimeter 56 is preferably circular and the corresponding outer perimeter 58 is preferably rectangular, the inner perimeter 56 may be elliptical in an alternate embodiment.

The terminal 34 optimally includes a copper base 37. The terminal 34 may further comprise a nickel layer 38 and a noble metal layer 40 as shown. The nickel layer 38 plates the copper base 37 and the noble metal layer 40 plates the nickel layer 38. Although the nickel layer 38 and the noble metal layer 40 are shown as covering the entire copper base 37, the nickel layer 38 and the noble metal layers 40 may be limited to the interface between the copper base 37 and the electrically resistive material to maintain a reliable and consistently constant resistance over the lifetime of the integral component. The nickel layer 38 and the noble metal layer 40 may be minimized in extent to form a barrier only between the copper base 37 and the electrically resistive material.

In an alternate embodiment, the terminal 34 has a generally elliptical inner perimeter bordering the electrically resistive volume 36 and the component pad 27 has a corresponding elliptical shape, proportionally scaled to the elliptical inner perimeter. In yet another alternate embodiment, the terminal has a generally annular shape.

The electrically resistive volume 36 of the surface-mount device package 60 contains a resistive material. The electrically resistive volume 36 is bounded by the terminal 34 and the component pad 27 such that the electrically resistive volume 36 is preferably annular in this embodiment. The electrically resistive material optimally comprises a polymer and electrically conductive particles dispersed in the polymer. The electrically conductive particles preferably comprise carbon particles. The resistive material preferably has a bulk resistivity within a range from approximately 5 ohm-centimeters to approximately 100 ohm-centimeters. Direct electrical current applied to the integral resistor 32 is primarily conducted through the resistive material 36 in a radial direction between the component pad 27 and the terminal 34.

The resistive material may comprise any suitable resistive ink composition, such as a polymer thick-film (PTF) ink of the type comprising a polymer matrix in which carbon particles are dispersed to achieve a desired level of conductivity. A preferred ink composition known in the art contains carbon particles dispersed in a heat-curable polymer, preferably a phenolic resin, although other materials could be substituted. A screening mask or stencil can be used to deposit the thick-film ink on the interposer 14 so as to partially cover the component pad 27 and outer terminal 34.

If thick-film resistive ink is used to form the resistive material, the resistive volume 36 preferably has a sheet resistivity within a range extending from approximately 1 kiloohms per square to approximately 100 kiloohms per square. The resistive material of the thick-film resistive ink preferably has a thickness within a range of approximately ten to approximately twenty micrometers.

An optional solder mask 42 overlies the resistive volume 36, through which solder is subsequently deposited on the component pad 27 to form the solder bump 28 shown in FIG. 1. The solder bump 28 will later form a solder connection with a conductor 16 on the circuit board 18.

The terminal 34 is preferably adapted to form one plate of a parallel plate capacitor 48. A conductive plate 44 forms the other plate of the capacitor 48. The capacitance of the capacitor depends upon the dielectric constant of the dielectric material bounding the plates, the overlapping area of the plates, and the separation between the plates, among other factors. In a preferred embodiment, the capacitance has a range from 10 pF to 500 pF. 100 pF is illustrative of a typical capacitance which may be readily achieved through the integral resistor-capacitor assembly 50 of the invention. The terminal 34 preferably has a surface area within a range from approximately 10 square millimeters to approximately 100 square millimeters. The conductive plate 44 is separated from the terminal 34 by a dielectric region 46 having a thickness within a range from approximately five to fifty microns. The plate 44 and the terminal 34 are oriented substantially parallel to each other.

The surface-mount device package 60 optimally has an external terminal 25 on the interposer 14. The conductive plate 44 is electrically accessible through the external terminal 25. The external terminal 25 may be coextensive with the conductive plate 44, an extension of the conductive plate 44, or a signal trace coupled to the conductive plate 44. As shown in FIG. 2 the external terminal 25 is located on a side of the surface-mount device package 60. However, in an alternate embodiment the external terminal 25 may extend from the first face 52 in a manner similar to the solderable pad 26. In such a case, the external terminal 25 is connected to the conductive plate 44 through a metallized via.

In practice, the surface mount device package 60 may comprise a ball grid array (BGA) package as shown. The BGA package includes the die 12, such as an IC chip, mounted to the interposer 14, which in turn is shown as being ready for registration with conductors 16 on the circuit board 18. Vias 30 through the interposer 14 provide electrical connection between the die 12 and circuit board 18. The circuit board 18 can be of any suitable type for electronics applications, such as a printed wiring board, a flexible circuit, a ceramic substrate, a silicon substrate, any dielectric layer of a multi-layer board, or a conductive foil of a multi-layer board. While FIG. 1 illustrates the BGA with the die 12 that is flip-chip mounted to the interposer 14, other surface-mount devices and mounting configurations fall within the scope of this invention.

According to this invention, electrical resonances and reflections associated with interconnections required by the BGA when used in a high-speed digital application may be eliminated or at least substantially reduced by incorporating the integral resistor 32 or the integral resistor-capacitor combination 50 at one or more of the electrical connections 64 and 66 of the BGA, instead of using discrete resistors and capacitors known in the art.

FIG. 1 illustrates various possible electrical connections 64 and 66 associated with the SMD package 60 that is equipped with one or more integral passive components. Although FIG. 1 illustrates an integral passive component located externally to the SMD package 60 at an external interconnection 66, in an alternate embodiment the integral passive component is located internally within the SMD package 60 at an internal interconnection 64. The external interconnection 66 is located between the interposer 14 and the substrate 18. For example, the external interconnection 66 comprises the component pad 27 on the lower surface of the interposer 14, the conductors 16 on the substrate 18, and solder bump connections that will be formed by solder bumps 28 on the component pads 27. Any of the solderable pads 26 can be designed and configured as a component pad 27, which is electrically connected to an electrode of an integral resistor 32 or a resistor/capacitor combination 50. The internal interconnection 64 is located between the die 12 and the interposer 14, represented by internal pads 20 on the die 12, conductors 22 on the upper surface of the interposer 14, and solder bump connections therebetween.

In a preferred embodiment the integral passive component (i.e. resistor-capacitor combination 50) is associated with an external interconnection 66 as shown. One electrode of each of the integral passive components may be electrically connected to a corresponding component pad 27 of a ball grid array package. Locating the integral passive component upon a printed circuit board side (i.e. lower side) of the interposer 14 is practical for the following reasons: (a) compatibility of low-cost printing and patterning techniques with the pitch and diameter of the external solderable pads 26 and component pads 27 and (b) avoiding complicating the yield and testing of the circuit board 18. Accordingly, FIG. 1 through FIG. 9 best represent an integral passive component incorporated into an external interconnection 66 on a lower surface of the interposer 14, although the following discussion is generally applicable to similar configurations in which the integral passive component is associated with internal interconnections 64, including internal pads 20 on the die 12, the conductors 22 on the upper surface of the interposer 14, or the conductors 16 on the circuit board 18.

Although FIG. 1 illustrates a singular integral component as resistor-capacitor combination 50, any number of electrical interconnections of the SMD package 60 may be equipped with integral components. Similarly, while FIG. 1 illustrates a resistor-capacitor combination 50 as the integral component assembly, an integral resistor 32 alone may be integrated into one or more of the electrical interconnections 60 and 66 of the SMD package 60. In an alternate embodiment where the SMD package 60 comprises a BGA package 60, the BGA package 60 illustratively may have a first electrical interconnection that incorporates an integral resistor, a second electrical interconnection that incorporates an integral resistor-capacitor combination, and a third electrical interconnection that does not incorporate the integral resistor or the integral resistor-capacitor combination.

Figure 5:
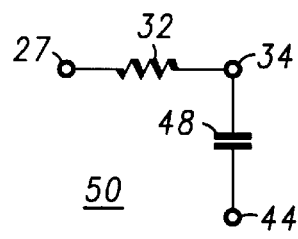
FIG. 5 is an electrical schematic showing the integral resistor-capacitor assembly of FIG. 1.

FIG. 5 shows a schematical diagram of the integral resistor-capacitor combination 50 integrated into the SMD package 60 of the present invention. Like numbered reference numerals indicate like elements in FIG. 1 through FIG. 5.

Figure 6:
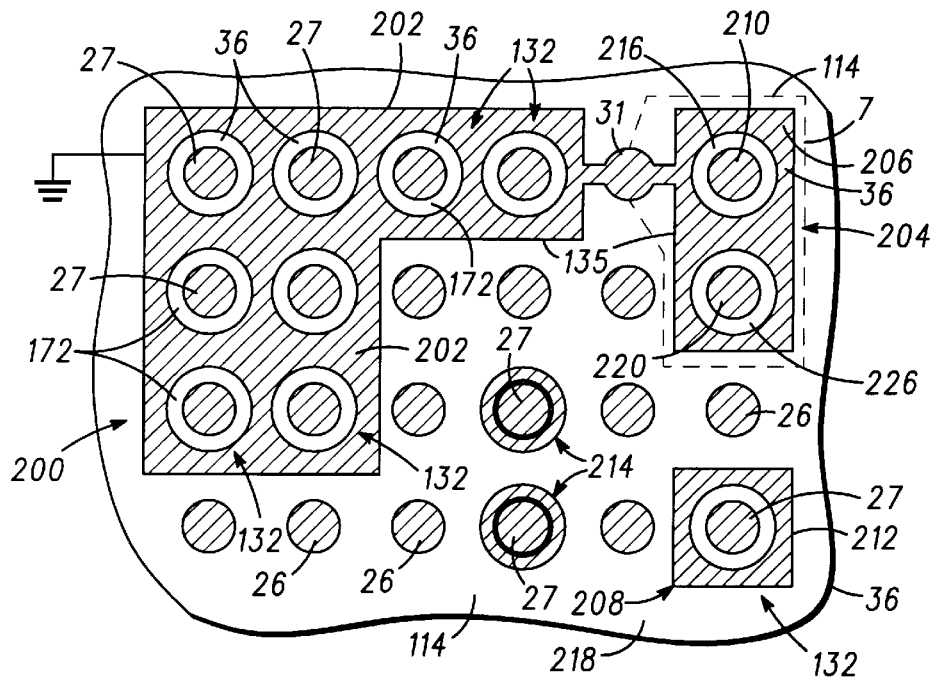
FIG. 6 is a plan view of an interposer of a surface-mount device package showing a plurality of integral resistors with a common signal trace or terminal.

FIG. 6 shows a plan view of an interposer 114 or a circuit board incorporating several illustrative integral resistor assemblies 200, 204, 208 and 214. The interposer 114 is preferably a portion of an SMD package. The integral resistor assembly 200 comprises a plurality of integral resistors 132. The integral resistors 132 have component pads 27, a common terminal 202, and electrically resistive volumes 36. The component pads 27 are separated from the common terminal 202 by the electrically resistive volumes 36 located between the component pads 27 and the common terminal 202. The common terminal 202 and the solderable pads 26 may be constructed from copper and may be plated with supplementary metallic layers as described in conjunction with FIG. 1. The resistive volumes 36 preferably include a polymeric material with electrically conductive (i.e. metallic) particles dispersed in the polymeric material similar to the resistive material described with reference to FIG. 1.

Each of the integral resistors 132 has a common electrode and an independent electrode. The common electrodes are united to form the common terminal 202, which is shown as being connected to ground. Meanwhile, the component pads 27 represent the independent electrodes. The common terminal 202 preferably comprises a metallic sheet having a plurality of openings 172 geometrically centered about an array of the component pads 27. The openings 172 encompass the resistive volumes 36 and corresponding component pads 27 disposed inward from the respective resistive volumes 36. The openings 172 are preferably curved or circular, as illustrated. The component pads 27 and the common terminal 202 are conductive portions of the board. The conductive portions and traces of the board are illustratively shown as the dark areas, while the dielectric region and the resistive volumes are shown as the light areas.

A first integral resistor assembly 200 of eight integral resistors 132 share a first common terminal 202, which is illustratively connected to ground. The integral resistor assembly 204 contains two integral resistors that share a second common terminal 206, which is illustratively connected to ground. A sole integral resistor 208 is shown in the lower right-hand corner of the interposer 114. A sole terminal 212 of the sole integral resistor 208 is not connected to the first common terminal 202 or the second common terminal 206.

The second integral resistor assembly 204 comprises a first integral resistor and a second integral resistor associated with a surface-mount device. The first integral resistor includes a first pad 210, a first solder bump (not shown) the common terminal 206, and first resistive volume 216. The first pad 210 is located on the first surface 218. The first solder bump is located on the first pad 210. The common terminal 206 is spaced radially apart from the first pad 210. The first terminal 214 surrounds the first pad 210 in at least one common plane that bisects the first pad 210 and the first terminal 214. The first resistive volume 216 intervenes between the first pad 210 and the first terminal 214. The first pad 210 is electrically and resistively connected to the first terminal 214 through the first resistive volume 216.

A second pad 220 is located on the first surface 218. A second solder bump (not shown) is located on the second pad 220. The common terminal 206 is spaced radially apart from the second pad 220. The common terminal 206 surrounds the second pad 220 in at least one common plane that bisects the second pad 220 and the common terminal 206. The second resistive volume 226 intervenes between the second pad 220 and the common terminal 206. The second pad 220 is electrically and resistively connected to the common terminal 206 layer through the second resistive volume 226.

The second common terminal 206 comprises a coplanar signal trace on the interposer 114. Accordingly, the first integral resistor and the second integral resistor are electrically connected together at the second common terminal 206. In a preferred embodiment, common terminal comprises a ground plane. However, in alternate embodiments the common terminal may be connected or coupled to an energy source, a supply voltage, positive logic terminal, a negative logic terminal, or the like.

As shown in FIG. 6, the component pad 27 will typically be one of many pads on the lower surface of the interposer 114. As also shown, the common 202, 206 and 212 can be shared by any number of integral resistors, yielding parallel integral resistors. As depicted, parallel resistors are grounded by grounding of the common terminals 202 and 206 to a ground plane (not shown) on the substrate through a ground pad 31 and a suitable interconnect layer on the substrate. The ground pad 31 may be simultaneously employed as a ground contact for the IC. The sole integral resistor 208 may be grounded in the manner described above to yield a parallel resistor, or electrically connected to circuitry on the substrate (i.e. printed circuit board) to yield a series resistor.

From the above, it will be understood that various combinations of series resistors and parallel resistors could coexist on the same surface of the interposer 114. Furthermore, the resistance value of any particular resistor can be independently varied from other resistors on the interposer 114. A suitable value for a termination resistor is about fifty ohms, which can be easily achieved on the surface of the interposer 114 using typical screening, stenciling and curtain coating techniques to yield a thickness of about ten to twenty micrometers for the resistive material of the resistive volumes when using conventional solder pad diameters of about 75 to about 750 micrometers, resistor outer dimensions compatible with conventional 125 to 1250 micrometer pad array pitches, and available resistor materials with sheet resistivities of about 5 to about 100 kiloohms/square.

Figure 7:
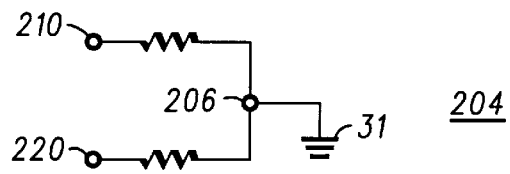
FIG. 7 is a schematic representation of a portion of FIG. 6 labeled 7.

FIG. 7 is a schematic illustration of the portion of the circuit board labeled 7 on FIG. 6, as indicated by the dashed lines. FIG. 7 schematically illustrates the second integral resistor assembly 204 of FIG. 6, including two integral resistors with the second common terminal 206 coupled to ground. The integral resistors are integrated into the SMD package in accordance with the present invention. Like-numbered reference numerals indicate like elements in FIG. 6 and FIG. 7.

Figure 8:
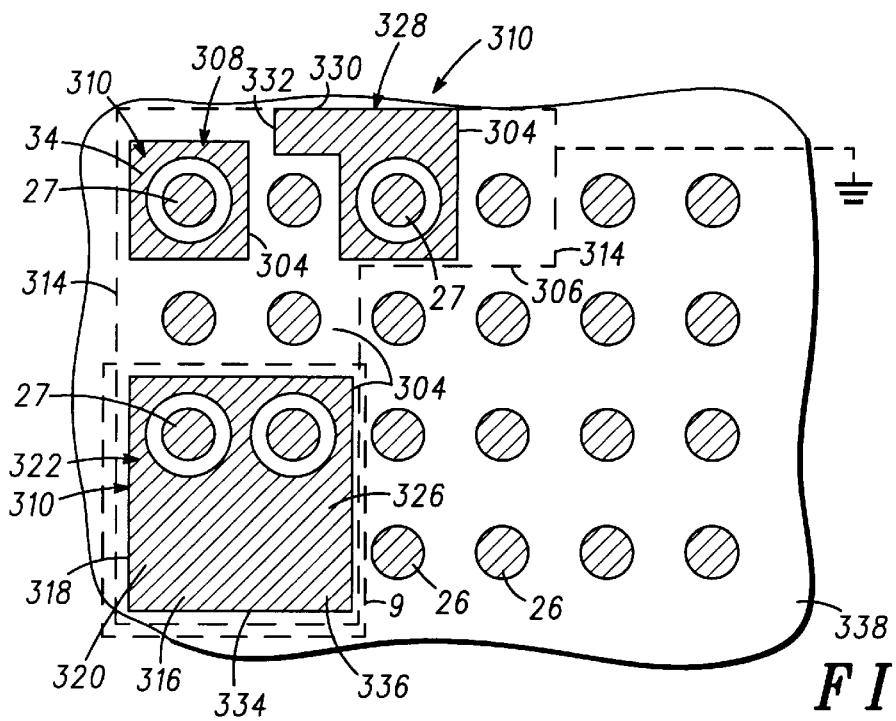
FIG. 8 is a plan view of a circuit board showing a plurality of integral resistor-capacitor assemblies labeled 9.

FIG. 8 shows a plan view of an interposer 338 of an SMD package illustratively incorporating integral resistors 310 and a common integral capacitor 304. As illustrated in FIG. 8, the integral resistors 310 may be coupled to a common conductive plate 306 of the common integral capacitor 304. The common conductive plate 306 is preferably located within the interposer 338. FIG. 8 is similar to FIG. 6, but further incorporates the common integral capacitor 304 having the common conductive plate 306 separated from the terminals (i.e. common terminal 326, terminal 34 and oversized terminal 330) of the integral resistors 310 by a dielectric region on the interposer 338 or substrate. The common conductive plate 306 is oriented substantially parallel to the terminals of the integral resistors 310. The component pads 27, the solderable pads 26, and terminals comprise the conductive portions of the interposer 338. The conductive portions and traces of the interposer 338 are illustratively shown as the dark areas, while the dielectric portion and the resistive volumes are shown as the light area.

A first integral resistor-capacitor assembly 308 comprises one of the integral resistors 310 coupled to the common conductive plate 306 through a terminal 34. The common conductive plate 306 is shown in phantom by dashed lines with a rectilinear contour 314 and a plate surface area 318. A dielectric region is located between the common conductive plate 306 and the terminal 34. The common conductive plate 306 is capacitively coupled to the terminal 34 via the dielectric region (not shown). The conductive plate 306 has a plate shape and a plate surface area 318 that equals or exceeds a terminal shape and a terminal surface area of the terminal 34.

A second integral resistor-capacitor assembly 322 comprises two other integral resistors 310 that share a common terminal 326. The common terminal 326 forms one plate of a parallel plate capacitor, while the common conductive plate 306 forms another conductive plate of a parallel plate capacitor. The common terminal 326 may be divided into a first terminal 316 and a secondterminal, although the common terminal 326 is a singular electrically continuous metallization. The second integral resistor-capacitor assembly 322 is indicated by the dashed lines labeled 9. The common conductive plate 306 is capacitively coupled to the common terminal 326 to permit the transmission of signals between the conductive plate and the common terminal 326. As used herein, the adjectival prefix "common" shall mean shared by two or more conductive members and common shall not refer to ground potential.

A third integral resistor-capacitor assembly 328 is located in the upper right-hand corner of the interposer 338, as illustrated in FIG. 8. The third resistor-capacitor assembly 328 has a generally oversized terminal 330 with a generally rectilinear perimeter 332 formed by the union of two rectangles to thereby increase the capacitance of the second resistor-capacitor assembly 322 in comparison to the first resistor-capacitor assembly 308 in which the terminal 34 has a smaller surface area.

The integral resistors 310 are capacitively coupled to each other via the common conductive plate 306, which has the outline of its perimeter illustrated as a dashed line. The terminal and/or common terminal 326 of the integral resistors 310 form one of two capacitive plates which may be increased in overlapping surface area to produce the desired capacitance to the extent circuit density permits.

The surface-mount device includes a dielectric region between the common conductive plate 306 and the first terminal 316 and the second terminal 336. The common conductive plate 306 is capacitively coupled to first terminal 316 and the second terminal 336 via the dielectric region. The dielectric region may be divided into a first dielectric region between the common conductive plate 306 and the first terminal 316 and a second dielectric region between the common conductive plate 306 and the second terminal 336. The conductive plate is capacitively coupled to the first terminal 316 via the first dielectric region. The conductive plate is capacitively coupled to the second terminal 336 via the second dielectric region. The first terminal 316 and the second terminal 336 have a total terminal surface area 320 less than or equal to a plate surface area 318 of the common conductive plate 306. The total terminal surface area 334 may mirror and overlap with the plate surface area 318 of the common conductive plate 306.

Each integral resistor-capacitor assembly preferably includes an integral resistor 310 in series with the integral capacitor 304. Therefore, the integral resistor capacitor assembly provides parallel transmission line termination without the static power dissipation of a conventional resistor-only termination. The common conductive plate 306 is preferably grounded, such as with a via (not shown) connected to a ground pad 31 and then to an interconnect layer on the surface of the substrate (i.e. partial circuit board). Alternatively, the common conductive plate 306 could be connected to a power supply potential. The dielectric region can be any suitable BGA package or PWB dielectric material, though the use of other dielectric materials is foreseeable. For a termination resistance of about 50 ohms for the integral resistor, a suitable capacitance is on the order of 100 pico-Farads to attain an acceptable RC time constant for the series resistor/capacitor pair. Such a capacitance can be provided within a compact area by employing suitably thin dielectric materials such as suitable high density interconnect (HDI) dielectrics or thin circuit board dielectrics conventionally employed in the fabrication of BGA interposers. Capacitance per unit area can further be enhanced by filling the polymer dielectric with a high dielectric constant ceramic powder.

Multiple solderable pads 26 and component pads 27 are typically present on the lower surface of the interposer 338. As shown, the common conductive plate 306 can be shared by any number of integral resistors 310, yielding parallel resistor/capacitor pairs. As shown, the common conductive plate 306 is grounded such as by direct grounding to a ground plane (not shown) on the interposer 338 through a connection made between the common conductive plate 306 and a suitable interconnect layer on the substrate, for example, through a via and solder pad connection. The surface regions, integral resistors 310, integral capacitors, integral resistor-capacitor assemblies, and plain solderable pads 26 shown in FIGS. 6 and 8 can coexist on the same interposer 338, yielding any combination of series integral resistors 310, parallel resistors and integral resistor/capacitor combinations.

Figure 9:
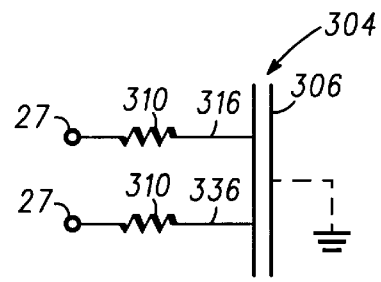
FIG. 9 is a schematic representation of a portion of FIG. 8.

FIG. 8 is representative of the physical structure of resistor-capacitor assemblies, while FIG. 9 is a schematic illustration of the portion of the circuit board labeled 9 on FIG. 8, as indicated by the dashed lines. FIG. 9 schematically shows two of the resistors 310 which are coupled to the conductive plate. Like-numbered reference numerals indicate like elements in FIG. 8 and FIG. 9.

Figure 10:
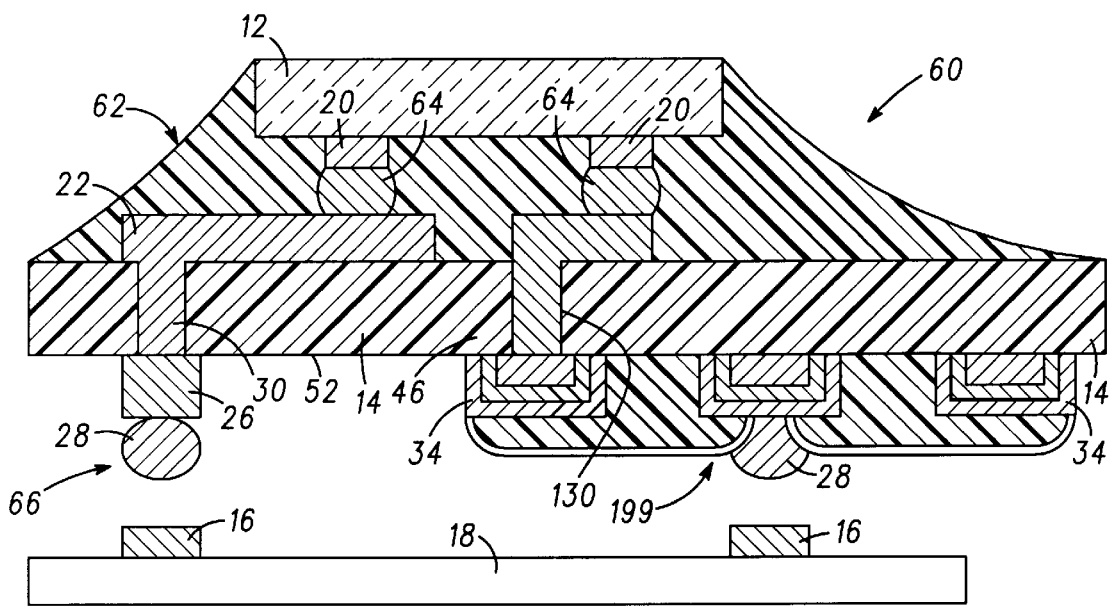
FIG. 10 is a cross sectional view of a surface-mount package having an integral resistor.

FIG. 10 illustrates an alternate embodiment of a surface-mount device package 160 in which an integral resistor 199 is electrically connected to an integrated circuit die 12 through at least one via 130. The via 130 places the integral resistor 199 in series with an internal lead or electrode of the surface-mount device.

While our invention has been described in terms of particular embodiments, it is apparent that other forms could be adopted by one skilled in the art. For example, the terminals and conductors of the resistors and capacitors could be formed using methods other than those discussed. Furthermore, processes and materials other than those described could be used to form the dielectric and electrically resistive elements. Accordingly, the scope of our invention is to be limited only by the following claims.

What is claimed is:

1. A surface-mount device having internal and external electrical interconnections, the device comprising:
    a pad located on a face of the surface-mount device, the pad being a component of one of the internal and external electrical connections;
    a solder bump bonded to the pad;
    a terminal located on the face and surrounding the pad so as to be spaced radially apart from the pad; and
    an electrically-resistive volume intervening between the pad and the terminal, the pad being electrically coupled to the terminal through the electrically-resistive volume so as to define an integral resistor.

2. The surface-mount device according to claim 1 wherein the pad is composed of a solderable metal selected from the group consisting of nickel and copper.

3. The surface-mount device according to claim 1 wherein the surface-mount device comprises a package and wherein the pad is located internally within the package.

4. The surface-mount device according to claim 1 wherein the surface-mount device comprises a package and wherein the pad is located externally outside the package.

5. The surface-mount device according to claim 1 wherein the terminal has a generally curved inner perimeter bordering the electrically resistive volume and a generally rectilinear outer perimeter.

6. The surface-mount device according to claim 5 further comprising a conductive plate separated from the terminal by a dielectric region having a thickness within a range from approximately five to fifty microns, the conductive plate and the terminal being oriented substantially parallel to each other.

7. The surface-mount device according to claim 6 further comprising an external terminal on the surface-mount device, the plate being electrically accessible through the external terminal.

8. The surface-mount device according to claim 1 wherein the terminal has a generally circular inner perimeter bordering the electrically resistive volume and a generally rectangular outer perimeter.

9. The surface-mount device according to claim 8 further comprising a conductive plate separated from the terminal by a dielectric region having a thickness within a range from approximately five to fifty microns, the conductive plate and the terminal being oriented substantially parallel to each other.

10. The surface-mount device according to claim 9 further comprising an external terminal on the surface-mount device, the plate being electrically accessible through the external terminal.

11. The surface-mount device according to claim 8 wherein the terminal has a surface area within a range approximately 10 square millimeters to approximately 100 square millimeters.

12. The surface-mount device according to claim 1 wherein the electrically resistive volume contains a resistive material comprising a polymer and electrically conductive particles dispersed in the polymer.

13. The surface-mount device according to claim 12 wherein the electrically conductive particles comprise carbon particles.

14. The surface-mount device according to claim 1 wherein the resistive volume has a resistivity within a range from approximately 5 ohm-centimeters to approximately 100 ohm-centimeters.

15. The surface-mount device according to claim 1 wherein the resistive volume has a sheet resistivity within a range extending from approximately 1 kiloohms per square to approximately 100 kiloohms per square, and wherein the resistive volume has a thickness within a range of approximately ten to approximately twenty micrometers.

16. The surface-mount device according to claim 1 wherein the pad is composed of copper base, and further comprising a nickel layer and a noble metal layer; the nickel layer plating the copper base and a noble metal layer plating the nickel layer.

17. The surface-mount device according to claim 1 wherein the terminal is composed of a copper base, and further comprising a nickel layer and a noble metal layer; the nickel layer at least partially plating the copper base and the noble metal layer plating the nickel layer.

18. A surface-mount device for mounting to conductors on a substrate, the surface mount device comprising:
    an interposer comprising a first face, and oppositely-disposed second face, and external interconnections on the first face for attaching the interposer to the conductors on the substrate;
    a die attached to the second face of the interposer with internal interconnections;
    a pad associated with at least one of the external and internal interconnections;
    a terminal having a generally circular inner perimeter surrounding the pad and a generally rectilinear outer perimeter surrounding the pad;
    an electrically-resistive material contacting and electrically connecting the pad and the terminal so as to define an integral resistor associated with the at least one of the external and internal interconnections; and
    an integral capacitor connected in series with the integral resistor, the integral capacitor comprising a conductive plate and a dielectric material between the conductive plate and the terminal of the integral resistor.

19. The surface-mount device as recited in claim 18 wherein the pad, the terminal and the electrically-resistive material are on the die.

20. The surface-mount device as recited in claim 18 wherein the pad, the terminal and the electrically-resistive material are on the interposer.

21. A surface-mount device as recited in claim 18 further comprising a solder bump on the pad.

22. The surface-mount device as recited in claim 18 wherein the conductive plate is grounded.

23. The surface-mount device as recited in claim 18 wherein the surface-mount device comprises a second pad of at least one of the external and internal interconnections, a second terminal surrounding the second pad, and an electrically-resistive material contacting and electrically connecting the second pad and the second terminal so as to define a second integral resistor, wherein the integral resistor and the second integral resistor are connected to ground.

24. A surface-mount device comprising:

an interposer having a first surface for mating with a circuit board and a second surface opposite the first surface;

an integrated circuit die mounted to the interposer on the second surface;

a first pad located on the first surface;

a first solder bump located on the first pad;

a first terminal on the first surface and surrounding the first pad so as to be spaced radially apart from the first pad;

a first resistive volume intervening between the first pad and the first terminal, the first pad being electrically coupled to the first terminal through the first resistive volume so as to define a first integral resistor;

a second pad located on the first surface;

a second solder bump located on the second pad;

a second terminal on the first surface and surrounding the second pad so as to be spaced radially apart from the second pad; and a second resistive volume intervening between the second pad and the second terminal, the second pad electrically coupled to the second terminal through the second resistive volume so as to define a second integral resistor;

wherein the first and second integral resistors are connected to ground.

25. The surface-mount device according to claim 24 wherein the first terminal and the second terminal coextensively form a common terminal on the interposer.

26. The surface-mount device according to claim 25 wherein the common terminal comprises a coplanar signal trace forming a ground plane.

27. The surface-mount device according to claim 24 further comprising a conductive plate located within the interposer; the conductive plate oriented substantially parallel to the common terminal; the conductive plate capacitively coupled to the common terminal to permit the transmission of signals between the conductive plate and the common terminal.

28. The surface-mount device according to claim 24 further comprising a dielectric region between the conductive plate and the first terminal, the conductive plate capacitively coupled to the first terminal via the dielectric region, the conductive plate having a plate surface area that equals or exceeds a terminal surface area of the first terminal.

29. The surface-mount device according to claim 24 further comprising a first dielectric region between the conductive plate and the first terminal and a second dielectric region between the conductive plate and the second conductive layer, the conductive plate capacitively coupled to first the conductive layer via the first dielectric region, the conductive plate capacitively coupled to the second terminal via the second dielectric region; the first terminal and the second terminal having a total terminal surface area less than or equal to a plate surface area of the conductive plate.

* * * * *